United States Patent
Iwase et al.

(10) Patent No.: US 7,253,500 B2
(45) Date of Patent: **\*Aug. 7, 2007**

(54) SEMICONDUCTOR WAFER AND A METHOD FOR MANUFACTURING A SEMICONDUCTOR WAFER

(75) Inventors: Masao Iwase, Kanagawa (JP); Soichi Nadahara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/319,545

(22) Filed: Dec. 29, 2005

(65) Prior Publication Data

US 2006/0118916 A1    Jun. 8, 2006

Related U.S. Application Data

(63) Continuation of application No. 10/687,705, filed on Oct. 20, 2003, now Pat. No. 7,015,566.

(30) Foreign Application Priority Data

Oct. 21, 2002  (JP) .......................... P2002-305330
Mar. 28, 2003  (JP) .......................... P2003-092737

(51) Int. Cl.
    *H01L 29/06*    (2006.01)
(52) U.S. Cl. .................. 257/618; 257/48; 257/622; 257/797
(58) Field of Classification Search ................ 257/618, 257/48, 622, 797
    See application file for complete search history.

(56) References Cited

U.S. PATENT DOCUMENTS 6,004,405 A    12/1999   Oishi et al.
7,015,566 B2 *  3/2006   Iwase et al. ............... 257/618
7,057,259 B2 *  6/2006   Arikado et al. ............ 257/618
2001/0038153 A1  11/2001  Sakaguchi
2003/0003608 A1   1/2003  Arikado et al.

FOREIGN PATENT DOCUMENTS

| JP | 58-207621    | 12/1983 |
|----|--------------|---------|
| JP | 9-063938     | 3/1997  |
| JP | 10-256105    | 9/1998  |
| JP | 2000-223380  | 8/2000  |
| JP | 2000-223382  | 8/2000  |
| JP | 2001-101337  | 4/2001  |
| JP | 2001-118757  | 4/2001  |
| JP | 2001-351835  | 12/2001 |
| JP | 2002-353080  | 12/2002 |

OTHER PUBLICATIONS

Notification of Reasons for Refusal issued by the Japanese Patent Office on May 8, 2007, for Japanese Patent Application No. 2003-092737, and English-language translation thereof.

* cited by examiner

*Primary Examiner*—Sara Crane
(74) *Attorney, Agent, or Firm*—Finnegan, Henderson, Farabow, Garrett & Dunner, L.L.P.

(57) ABSTRACT

A semiconductor wafer includes (a) a first principal side and a second principal side opposite to each other, (b) a first bevel contour and a second bevel contour provided at an outer periphery of the first principal side and the second principal side, (c) a first recess formed in the first bevel contour, and (d) a first type of ID mark configured by a protruding dot provided on a bottom face of the first recess.

5 Claims, 18 Drawing Sheets

- S01 — CRYSTAL GLOWTH
- S02 — CIRCUMFERENCE GRINDING
- S03 — NOTCH FORMING
- S04 — CUTTING
- S05 — SLICING
- S06 — BEVELING
- S07 — BENT FORMING
- S08 — LAPPING
- S09 — ETCHING
- S10 — MIRROR POLISHING
- S11 — CLEANING AND TESTING
- S12 — ID MARK STAMPING

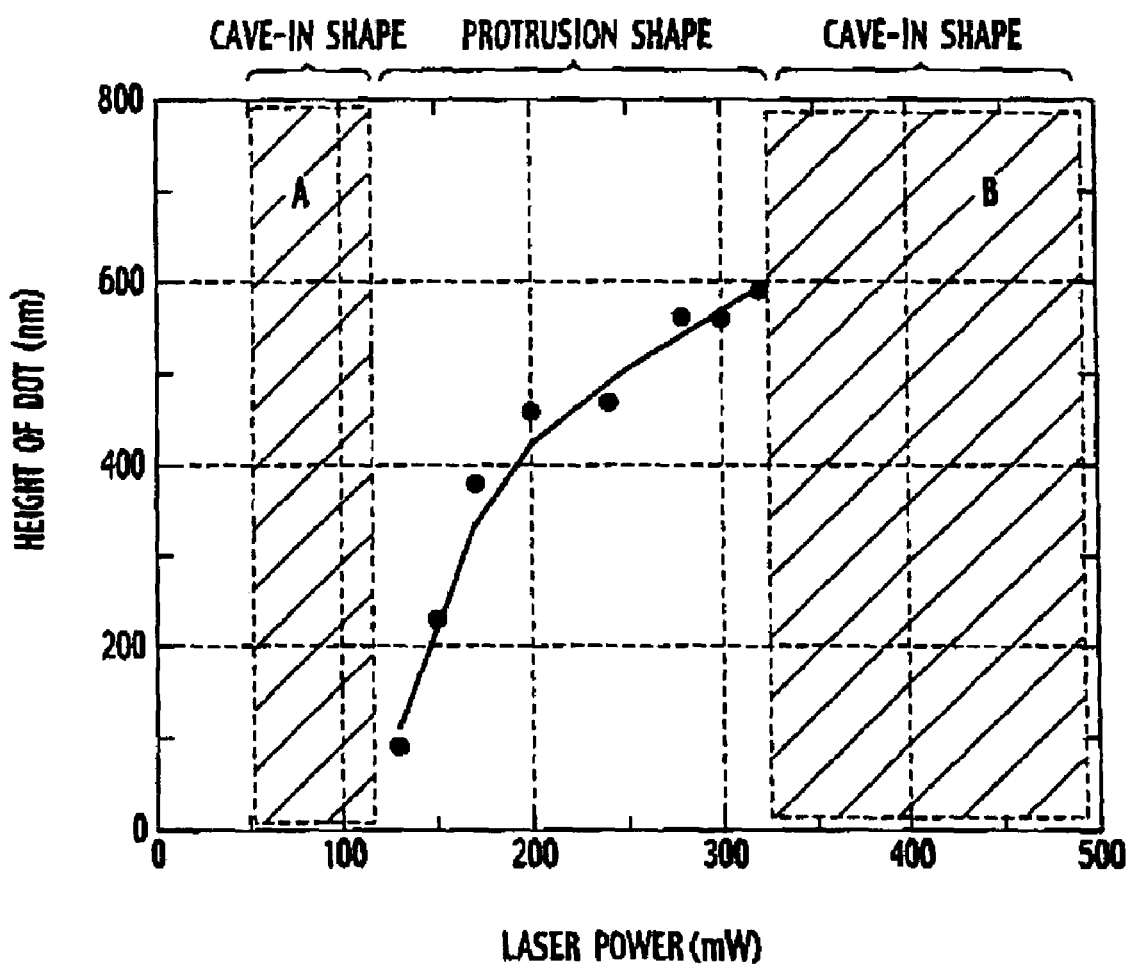

SEMICONDUCTOR WAFER AND A METHOD FOR MANUFACTURING A SEMICONDUCTOR WAFER

CROSS REFERENCE TO RELATED APPLICATIONS

This is a continuation of application Ser. No. 10/687,705, filed Oct. 20, 2003, now U.S. Pat. No. 7,015,566, which is incorporated herein by reference.

This application is based upon and claims the benefit of priority from the prior Japanese Patent Applications No. P2002-305330, filed on Oct. 21, 2002; the entire contents of which are incorporated herein by reference.

BACKGROUND OF THE INVENTION

1. Field of the Invention

The present invention relates to a semiconductor wafer, particularly to a semiconductor wafer having a highly visible ID mark provided at an outer peripheral part thereof, which is suitable for providing consistent production control of a manufacturing process of a semiconductor device, and to a method for manufacturing the semiconductor wafer.

2. Description of the Related Art

Usually, in a series of manufacturing processes of a semiconductor device, there are as many as several hundred processes where control of manufacturing conditions and the like are required. In manufacturing processes of the semiconductor device, strict manufacturing conditions need to be set in each manufacturing process. These manufacturing processes are controlled using an ID mark provided on a part of a principal side of the semiconductor wafer, including figures, characters, bar codes, etc.

The ID mark is usually made up of a number or a symbol showing the manufacture history for identifying the semiconductor wafer. Also, as the ID mark, a soft-mark engraved on a surface of the semiconductor wafer and a hard-mark engraved on a backside thereof are generally known. Both types of marks are made up of a plurality of recessed dots (holes) formed by irradiating the surface of the semiconductor wafer with a laser beam and locally removing silicon therefrom.

Namely, the ID mark is formed by a pulse laser beam irradiated continuously onto the surface of the semiconductor wafer through an optical system. The ID mark may have an engraved area of several mm x several cm under the present circumstances in order to ensure the visibility thereof for the people working in the manufacturing process. Therefore, the loss in element formation level area is large.

Also, dots are generally formed by irradiating a high-energy laser beam onto a part of the surface of the semiconductor wafer to melt and remove a spot-shaped part. In this case, silicon (particles) melted and removed are scattered around the dots to be deposited again on the surface of the semiconductor wafer. The particles inhibit the element formation, which greatly influences the quality of a semiconductor product.

The soft-mark formed on the surface of the semiconductor wafer in this way is recently in heavy usage in the semiconductor manufacturing process. If a chemical mechanical polishing process (hereinafter, referred to as "CMP process") is performed repeatedly, the soft-mark is flattened and a recognition ratio thereof decreases. Moreover, since the hard-mark is formed on the backside of the semiconductor wafer, the operation to reverse the semiconductor wafer to detect the hard-mark is an added step. In addition, a slight unevenness is formed on the backside of the semiconductor wafer, which leads to a blurred focus for lithography.

In order to avoid the blurred focus in semiconductor lithography and impairment of the element formation levels of the semiconductor wafer, the laser beam is irradiated onto a bevel contour of an outer peripheral part of the semiconductor wafer using a mark pattern to form an image of a mark. Extremely minute dots with a protruding shape are thus formed, which are raised from the surface of the bevel contour.

However, the ID mark made up of such extremely minute protruding dots is cut off every time a polishing cloth is brought into contact with the bevel contour and gradually disappears. Accordingly, the visibility of the ID mark is extremely decreased. Furthermore, information about the wafer with the decreased visibility, ID mark is fed back to the processing condition for the next manufacturing process. This feed-back process control leads to a wrong setting of the process condition and a malfunction of a process device and causes a fatal defect in the quality of the product. Therefore, consistent production control of the manufacturing processes of the semiconductor device cannot be achieved.

SUMMARY OF THE INVENTION

An aspect of the present invention inheres in a semiconductor wafer including (a) a first principal side and a second principal side opposite to each other, (b) a first bevel contour and a second bevel contour provided at an outer periphery of the first principal side and the second principal side, (c) a first recess formed in the first bevel contour, and (d) a first type of ID mark configured by a protruding dot provided on a bottom face of the first recess.

Another aspect of the present invention inheres in a semiconductor wafer including (a) a first principal side and a second principal side opposite to each other, (b) a first bevel contour and a second bevel contour provided at an outer peripheral part of the first principal side and the second principal side, (c) a first type of ID mark of protruding dots provided on at least one of the first bevel contour and the second bevel contour, and (d) a second type of ID mark of recessed dots provided on at least one of the first bevel contour and the second bevel contour.

Another aspect of the present invention inheres in a semiconductor wafer including (a) a first principal side and a second principal side opposite to each other, (b) a first bevel contour and a second bevel contour provided at an outer peripheral part of the first principal side and the second principal side, and (c) an ID mark of shape having a ring-shaped depression around a center protrusion.

Another aspect of the present invention inheres in a semiconductor wafer including (a) a first principal side and a second principal side opposite to each other, (b) a first bevel contour and a second bevel contour provided at an outer peripheral part of the first principal side and the second principal side, and (c) an ID mark including a combination of a first protruding dot and a second recessed dot at a part of the first bevel contour.

A foregoing aspect of the present invention inheres in a method for manufacturing a semiconductor wafer including (a) forming respectively a first bevel contour and a second bevel contour at an outer peripheral part of a first principal side and a second principal side of a wafer, and (b) providing a ID mark to at least one of the first bevel contour and the second bevel contour.

BRIEF DESCRIPTION OF DRAWINGS

FIG. 9 is a graph showing relationship between the shape of a dot formed on semiconductor wafer and laser power according to a second embodiment of the present invention.

DETAILED DESCRIPTION OF THE INVENTION

Figure 1A:
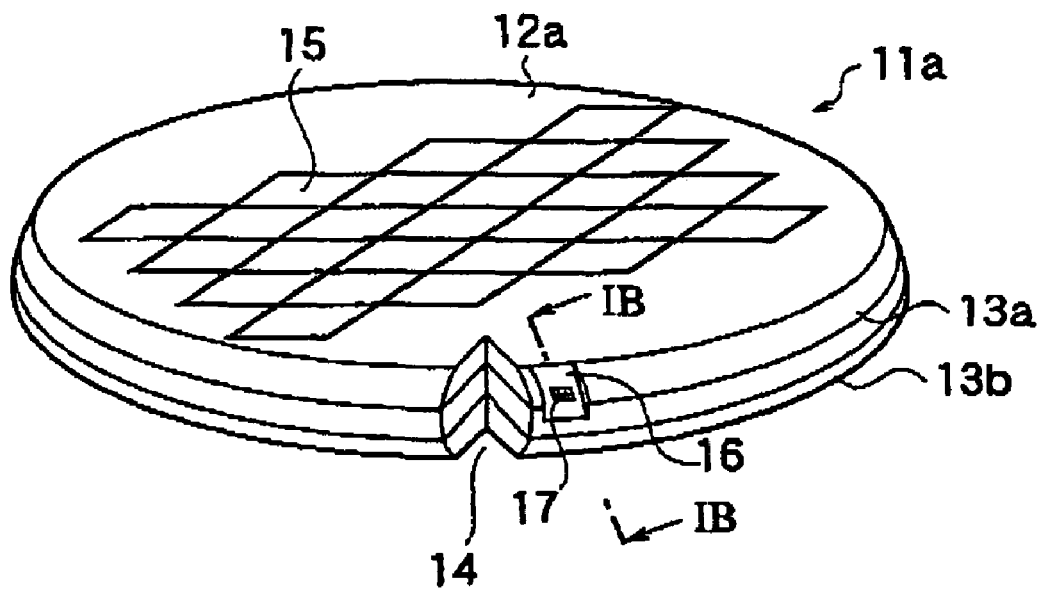
FIG. 1A is a perspective schematic view showing the configuration of a semiconductor wafer according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc. to provide a thorough understanding of the present invention. However, it will be obvious to those skilled in the art that the present invention may be practiced without such specific details.

First Embodiment

Figure 1B:
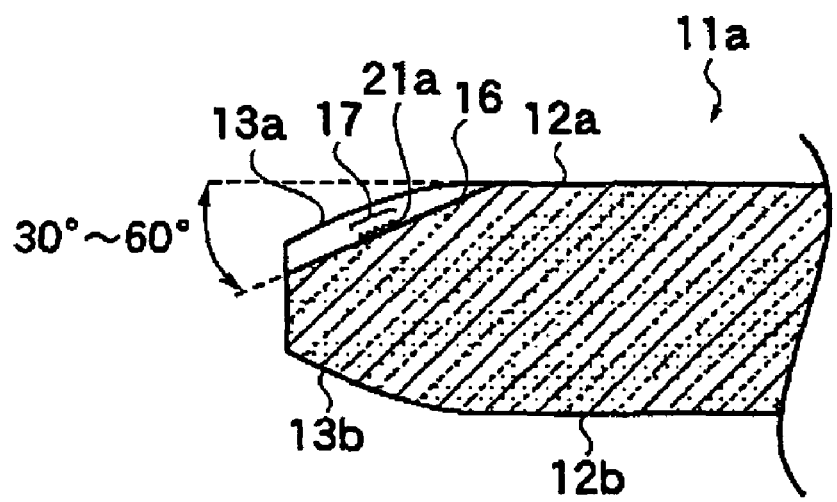
FIG. 1B is a sectional view taken on line IB-IB in FIG. 1A.

As shown in FIGS. 1A and 1B, a semiconductor wafer 11a according to a first embodiment of the invention includes: a first principal side (top surface) 12a and a second principal side (bottom surface) 12b opposite to each other; a first bevel contour 13a and a second bevel contour 13b provided at the outer peripheral part of the first principal side 12a and the second principal side 12b; and a first type of ID mark 17 made up of a first dot 21a provided at the first bevel contour 13a. On the first principal side 12a, a plurality of semiconductor elements 15 are formed. At a portion of the outer peripheral part of the semiconductor wafer 11a, a notch 14 showing a reference position is formed. At the first bevel contour 13a, a first recess 16 is formed close to the notch 14.

The first type of ID mark 17 is provided on a bottom face of the first recess 16. The first type of ID mark 17a indicates information related to the lot No. and a manufacture order of a product, a function of a product and the like. The ID mark may be an alphameric character, a bar code, a two-dimensional code, etc. For example, in the case where the first type of ID mark 17 is a two-dimensional code, it is made up of sixteen x sixteen of the first dots 21a, or eight x thirty-two of the first dots 21a. The first type of ID mark 17 is formed by extremely minute dots having a width of 6 μm and a height of 0.5 μm, for example. The first type of ID mark 17 is visually recognized by being monitored with a photoelectric transducer such as a charged coupled device (CCD) camera.

The bottom face of the first recess 16 is smooth. The inclination angle of the bottom face of the first recess 16 to the first principal side 12a is set in a range of 30° to 60°. This range is larger than the angle between the first principal side 12a and the first bevel contour 13a (about 22°). This is a preferable range without damaging the original purpose of the bevel contour. Further, the first recess 16 is preferably formed within approximately 10 mm from the notch 14. The distance is not particularly limited thereto. However, if the first recess 16 is formed close to the notch 14, movement time of the photoelectric transducer to visually recognize the first type of ID mark 17 can be shortened.

A method of manufacturing the semiconductor wafer 11*a* according to the first embodiment will be explained with reference to FIGS. 2 and 3 below.

Figure 2:
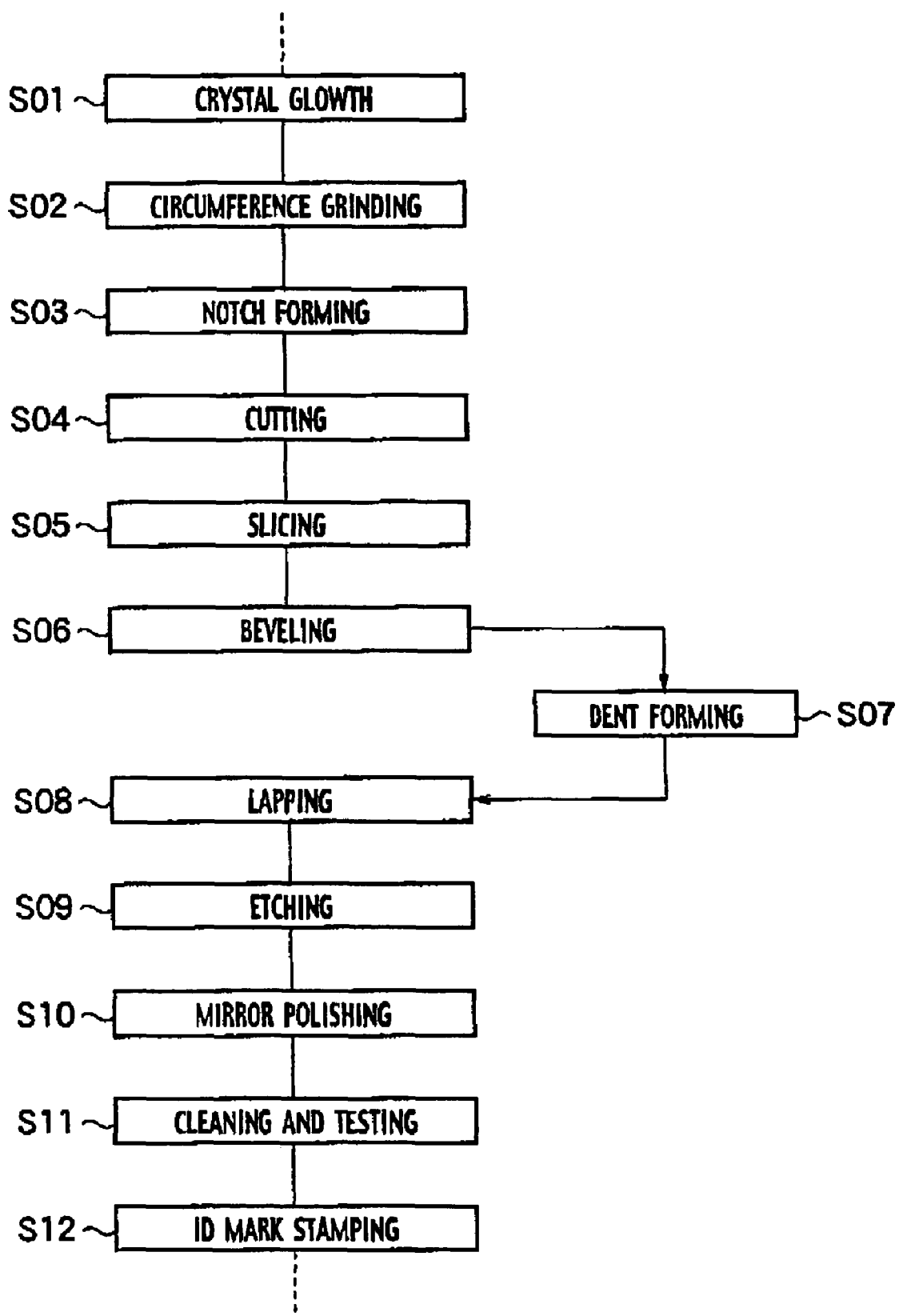
FIG. 2 is a flowchart for explaining a manufacturing process of a semiconductor wafer according to a first embodiment of the present invention.
Figure 3:
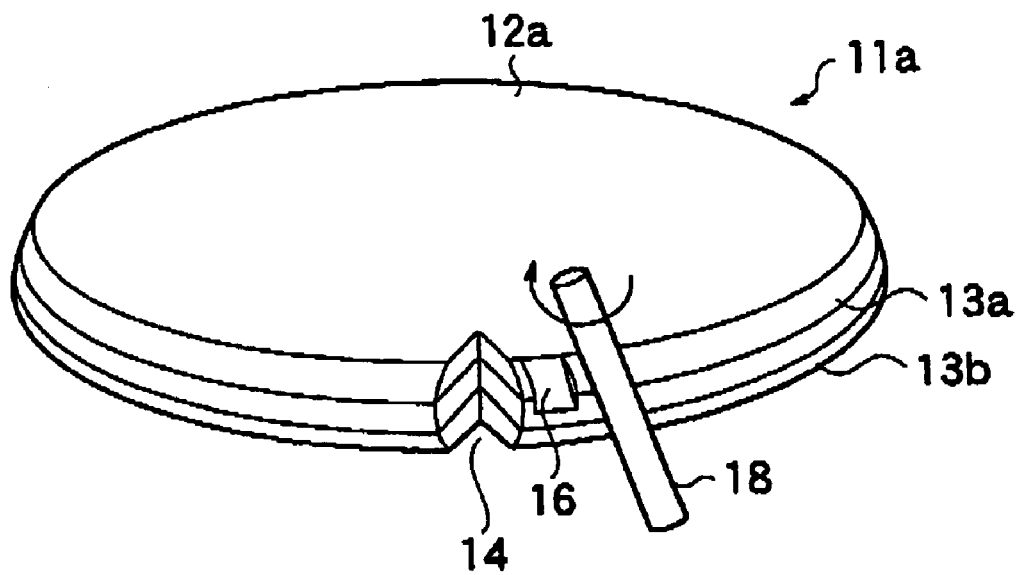
FIG. 3 is a conception diagram explaining a formation method of a hollow in a manufacturing process of a semiconductor wafer according to a first embodiment of the present invention.

(A) First, in step S01, as shown in FIG. 2, for example, a boron-doped p-type (100) silicon monocrystal ingot having a resistivity of 5 to 10 Ωcm is prepared. Next, in step S02, by polishing process, the outer peripheral part of the silicon monocrystal ingot is formed with a desired diameter. Thereafter, in step S03, the notch 14 having in-plane crystal orientation (usually showing a {110} orientation) of the semiconductor wafer is formed on the ingot. Then, the block cutting process of step S04 and slice processing of step S05 cut the ingot into a wafer shape.

(B) In step S06, the outer peripheral parts of the first principal side 12*a* and the second principal side 12*b* of the wafer, are beveled respectively, to form the first and second bevel contours 13*a* and 13*b*. In step S07, at a portion of the first bevel contour 13*a*, the first recess 16 is formed. At this time, the first recess 16 is formed, as shown in FIG. 3, by having a rotating grinder rod 18 pressed to a part of the first bevel contour 13*a*, thereby cutting off a part of the circumference of the first bevel contour 13*a*.

(C) In step S08, lapping is carried out on the first and the second principal sides 12*a* and 12*b* and the first and the second bevel contours 13*a* and 13*b* of the wafer.

(D) In step S09, an etching treatment is carried out in order to remove a large undulation on the first and the second principal sides 12*a* and 12*b* of the wafer. The etching treatment includes alkaline etching using an alkaline solution and acid etching using an acid solution. In step S10, a mirror-surface polishing process is carried out on the first principal side 12*a*, the first bevel contour 13*a*, and the first recess 16 of the wafer. Thereafter, in step S11, cleaning and testing of the wafer are carried out.

(E) In step S12, as shown in FIG. 1, the first type of ID mark 17*a* is provided on the bottom face of the first recess 16. At this time, dots constituting the first type of ID mark 17 are formed in a process of melting and re-crystallization of the surface of silicon by irradiating the bottom face of the first recess 16 with an He—Ne laser beam having a Gaussian-shape energy density distribution, for example.

According to the semiconductor wafer 11*a* of the first embodiment, the first recess 16 is formed at the first level contour 13*a*, and the first type of ID mark 17 is provided on the bottom face of the first recess 16. Therefore, a polishing cloth does not contact the bottom face of the first recess 16 at the time of the CMP process, thereby preventing the first type of ID mark 17 from being cut off. Accordingly, high visibility of the first type of ID mark 17 is maintained, and thus consistent production control of the manufacturing processes of the semiconductor device is enabled.

Note that in the first embodiment, explanation is given for the case where one first type of ID mark 17 is provided on the bottom face of the first recess 16. However, a plurality of ID marks may also be formed.

First Modification of First Embodiment

Figure 4:
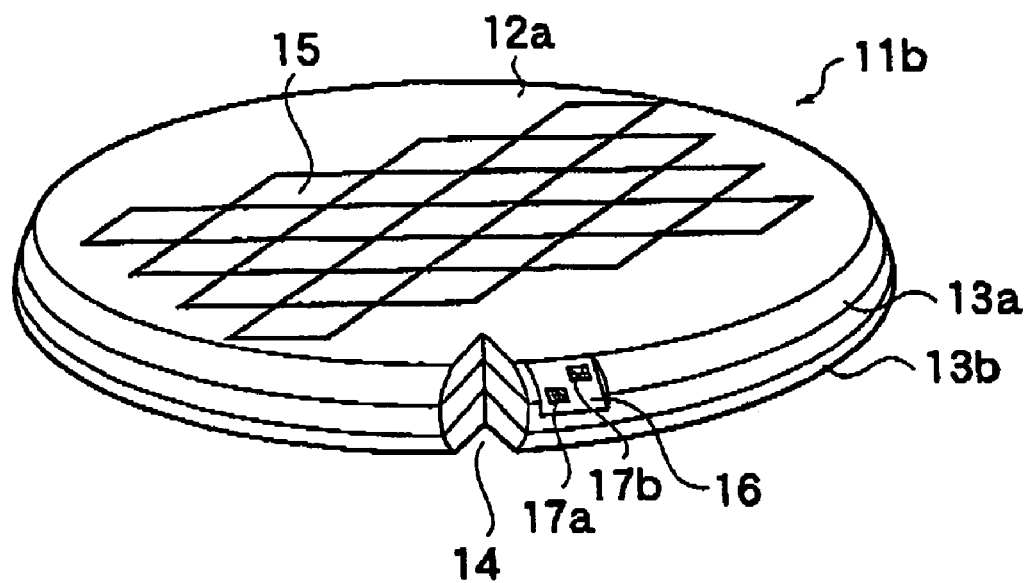
FIG. 4 is an outline view showing the configuration of semiconductor a wafer according to a first modification of the first embodiment of the present invention.

The semiconductor wafer 11*b* according to a first modification of the first embodiment of this invention is different from the first embodiment in that, as shown in FIG. 4, close to the notch 14, the ID mark 17*b* having the same code as that of the first type of ID mark 17*a* is further provided on the bottom face of the first recess 16 at a portion of the first bevel contour 13*a*. The first type of ID mark 17 is indicated by 17*a* and 17*b*. Other elements are substantially the same as that of the semiconductor wafer 11*a* shown in the first embodiment, therefore repeated explanation is omitted.

The first type of ID marks 17*a* and 17*b* are provided so as to have a space of about 100 μm in the longitudinal direction (in the thickness direction of the wafer), and about 500 μm in the lateral direction (in the circumferential direction of the wafer) between the marks. The first type of ID marks 17*a* and 17*b* have an area of 100 μm×100 μm, and provided as protruding-shape dots protruding from the bottom face of the first recess 16.

According to the first modification of the first embodiment, two ID marks such as the first type of ID marks 17*a* and 17*b* representing the same code are formed so, which are displaced from each other in the thickness direction and the circumferential direction of the semiconductor wafer 11*b*. Generally, in the CMP process intended for metal films such as tungsten (W), aluminum (Al), and copper (Cu), the closer the protruding-shape dots constituting the ID mark are to the second principal side 12*b*, the less the dots are cut off.

Therefore, according to the semiconductor wafer 11*b* of the first modification of the first embodiment, by use of the first type of ID mark 17*a* of the second principal side 12*b*, information can be read even when recognition failure occurs in the first type of ID mark 17*b* of the first principal side 12*a*. A consistent production control of the manufacturing processes of the semiconductor device is thus enabled.

Note that according to the first modification of the first embodiment, the first type of ID marks 17*a* and 17*b* are provided so as to be displaced from each other in the thickness direction and the circumferential direction acceptable for the marks of the semiconductor wafer 11*b*. However, it is also to be displaced to only in the thickness direction, or only in the circumferential direction.

Second Modification of First Embodiment

Figure 5A:
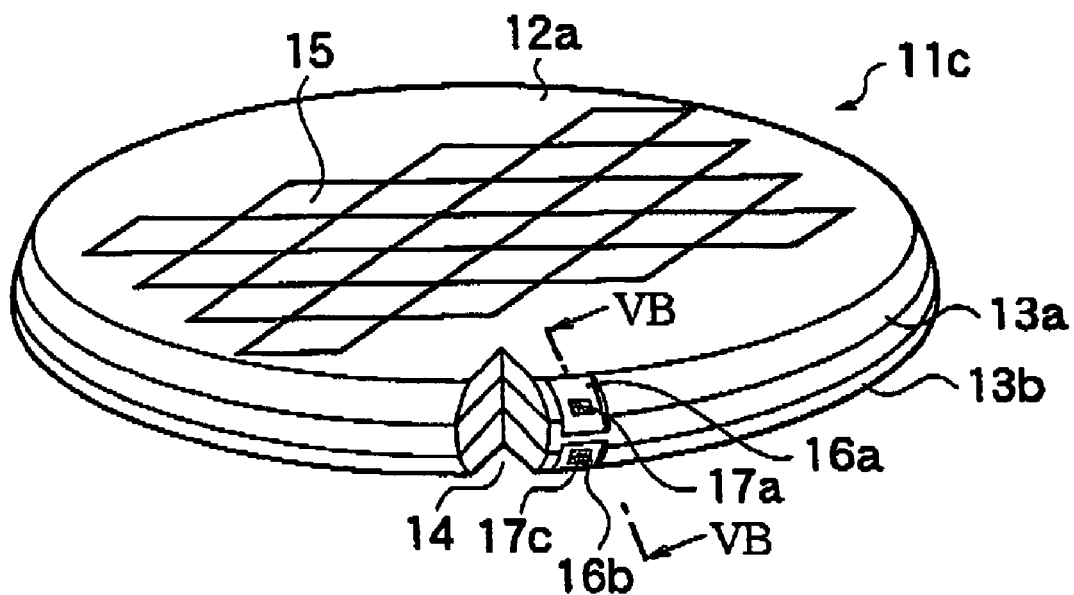
FIG. 5A is an outline view showing the configuration of a semiconductor wafer according to a second modification of the first embodiment of the present invention.
Figure 5B:
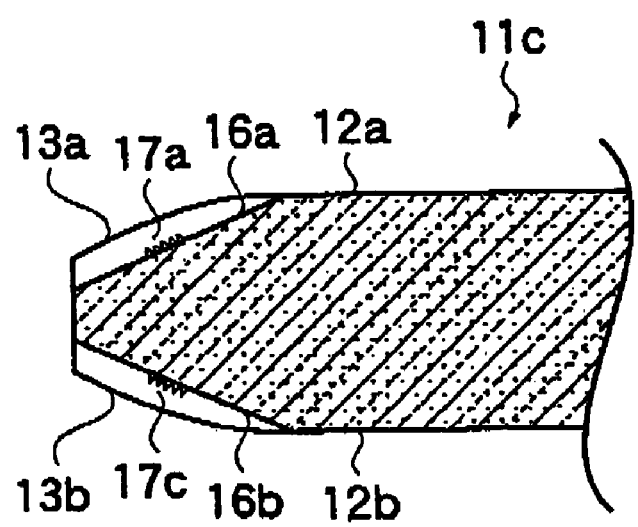
FIG. 5B is a sectional view taken on line VB-VB in FIG. 5A.

The semiconductor wafer 11*c* according to a second modification of the first embodiment of the invention is different from the semiconductor wafer 11*a* shown in the first embodiment in that, as shown in FIGS. 5A and 5B, a second recessed part 16*b* is formed close to the notch 14 of the second bevel contour 13*b*, and the first type of ID mark 17*c* having the same code as that of the first type of ID mark 17*a* is further provided on the bottom face of the second recessed part 16*b*. The first type of ID mark 17 is indicated by 17*c*. Other elements are substantially the same as that of the semiconductor wafer 11*a* shown in the first embodiment, therefore repeated explanation is omitted.

The second recessed part 16*b* is formed in the following manner. The first recess 16*a* is formed, and then the semiconductor wafer 11*c* is inverted, and as shown in FIG. 3, the grinder rod 18 is pressed to the second bevel contour 13*b* provided opposite to the first recess 16*a* while being rotated, and the silicon of that part is cut off.

The position of the second recessed part 16*b* to be formed is not particularly limited as described. However, by providing the second recessed part 16*b* at the position opposite to the first recess 16a, processing of the recess is facilitated. In addition, a mutual distance between the first type of ID marks 17*a* and 17*c* is decreased, resulting in shortened movement time of the photoelectric transducer for reading the first type of ID marks 17a and 17c.

According to the second modification of the first embodiment, the first type of ID mark 17c having the same code is formed also on the second principal side 12b of the semiconductor wafer 11c. Generally, in the CMP process intended for metal films such as W, Al, and Cu or the like, the polishing cloth is not brought into contact with the backside (the second principal side 12b) of the semiconductor wafer 11c. Therefore, the first type of ID mark 17c is maintained without being cut off. Thus, according to the semiconductor wafer 11c of the second modification of the first embodiment, even when recognition failure occurs for the first type of ID mark 17a of the first principal side 12a, by use of the first type of ID mark 17c of the second principal side 12b, the ID information can be read. Thus, consistent production control of the manufacturing processes of the semiconductor device can be enabled.

Note that according to the second modification of the first embodiment, the first recess 16a and the second recessed part 16b are provided opposite to each other. However, the recessed parts 16a and 16b may also be provided on a state displaced from each other in the lateral direction.

Third Modification of First Embodiment

Figure 6:
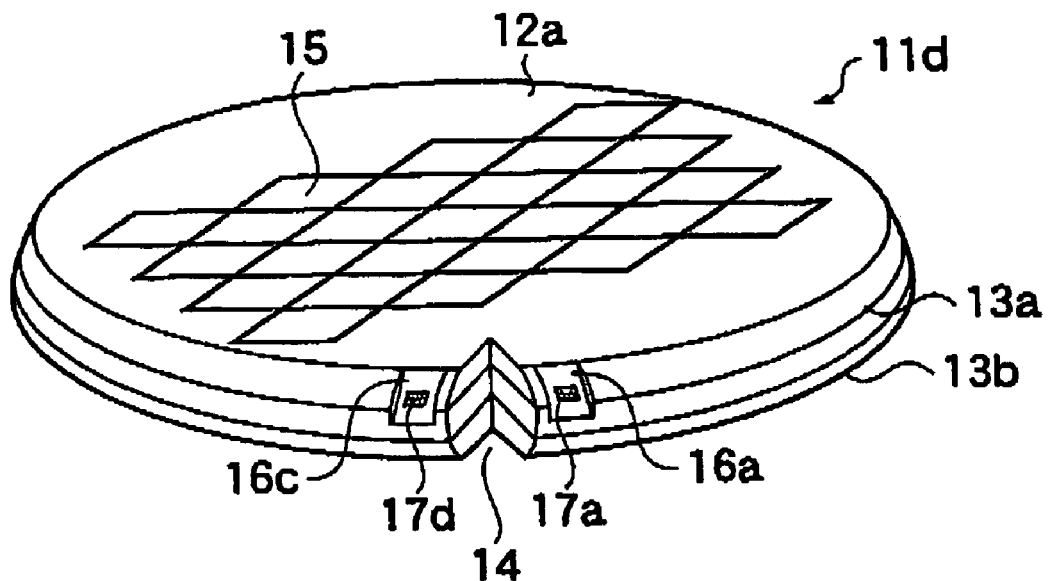
FIG. 6 is an outline view showing the configuration of a semiconductor wafer according to a third modification of the first embodiment of the present invention.

A semiconductor wafer 11d according to a third modification of the first embodiment is different from the semiconductor wafer 11a shown in the first embodiment in that, as shown in FIG. 6, a third recessed part 16c is formed at a portion of the first bevel contour 13a close to the notch 14 on the opposite side of the first recess 16a with the notch 14 interposed therebetween. The first type of ID mark 17d having the same code as that of the first type of ID mark 17a is provided on the bottom face of the third recessed part 16c. The first type of ID mark 17 is indicated by 17d. Other elements are substantially the same as that of the semiconductor wafer 11a shown in the first embodiment, therefore repeated explanation is omitted.

The third recessed part 16c is formed in the following manner. As shown in FIG. 3, the grinder rod 18 is pressed to the level including the first recess 16a and the third recessed part 16c while being rotated, and a part of the silicon of the outer peripheral portion of the first bevel contour 13a is cut off.

The position of the third recessed part 16c is not particularly limited to that described. However, if the position of the third recessed part 16c is continuously provided interposing the notch 14, processing of the recessed part is facilitated. In addition, the first type of ID marks 17a and 17d are formed close to the notch 14, resulting in shortened movement time of the photoelectric transducer for reading the first type of ID marks 17a and 17d. Therefore, according to the semiconductor wafer 11d of the third modification of the first embodiment, even when recognition failure occurs in one of the ID marks, by the use of the other ID mark, the information can be read. Thus, consistent production control of the manufacturing processes of the semiconductor device can be enabled.

Note that in the third modification of the first embodiment, as shown in the first modification of the above-described first embodiment, two ID marks may be formed at the first recess 16a and 16c so as to be displaced from each other in longitudinal and lateral directions, or may be formed in a line in the longitudinal and lateral directions.

Second Embodiment

Figure 7:
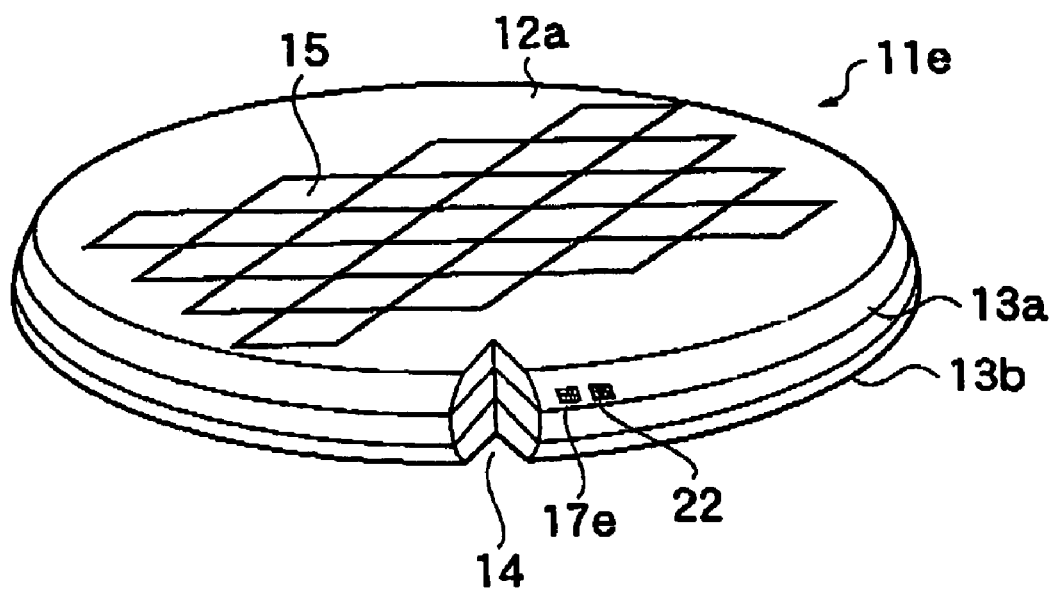
FIG. 7 is an outline view showing the configuration of a semiconductor wafer according to a second embodiment of the present invention.

A semiconductor wafer 11e according to a second embodiment is different from the semiconductor wafer 11a shown in the first embodiment in that, as shown in FIG. 7, a first type of ID mark 17e of protruding dots protruding from the surface of the first bevel contour 13a and a second type of ID mark 22 of recessed dots recessed from the surface of the first bevel contour 13a are formed side by side at a part of the first bevel contour 13a close to the notch 14. Furthermore, semiconductor wafer 11e according to the second embodiment is different in that first recess 16a shown in FIG. 1 are not formed. The first type of ID mark 17 is indicated by 17e. The second type of ID mark is indicated by reference number 22. Other elements are substantially the same as that of the semiconductor wafer 11a shown in the first embodiment, therefore repeated explanation is omitted.

Figure 8A:
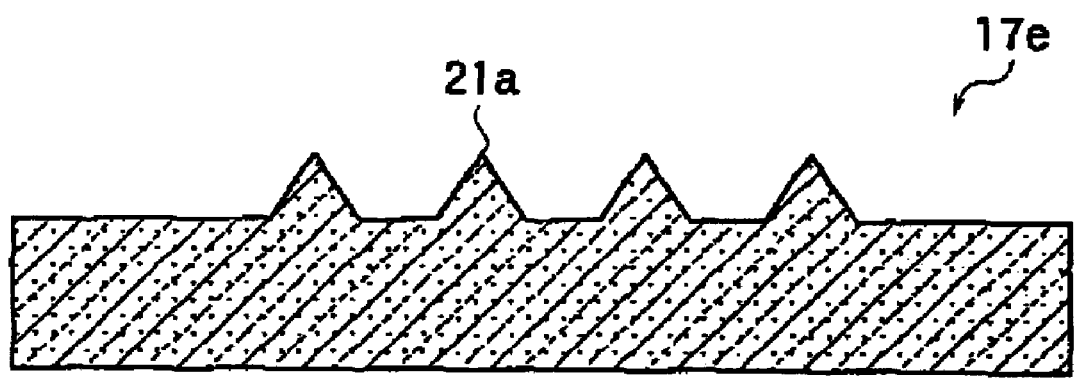
FIGS. 8A and 8B are sectional views showing an ID mark according to a second embodiment of the present invention.
Figure 8B:
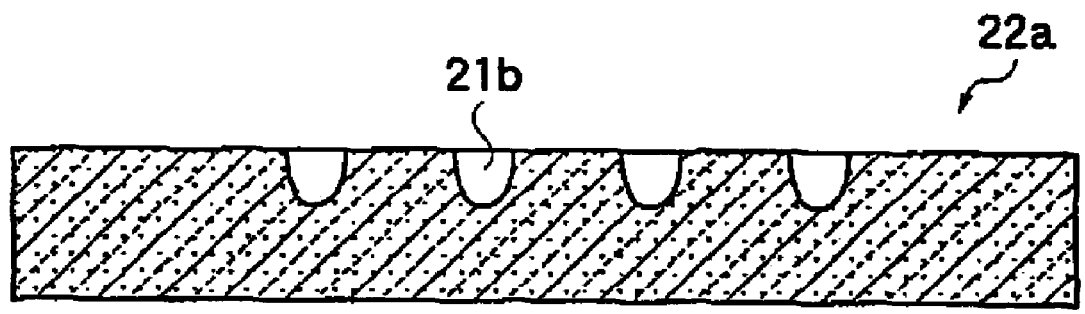

The first type of ID mark 17e and the second type of ID mark 22 are the same codes. A first dots 21a are protruded in a process of melting and re-crystallization of the surface of silicon shown in FIG. 8A. On the other hand, the second dots 21b are recessed from the surface of the first bevel contour 13a in a process of melting of the surface of silicon shown in FIG. 8B. For example, the first dots 21a and the second dots 21b are formed by irradiating a stepless pulse laser beam over an optical system at an appointed position of the first bevel contour 13a, and are formed by melting the semiconductor surface of the first bevel contour 13a. The first dots 21a and the second dots 21b are divided by changing laser power.

In FIG. 9, abscissa is laser power, and ordinate is dot height. In other words, FIG. 9 shows the relation between laser power and dot height. The control region of FIG. 9 show the relation in which the height of the first dots 21a of protruding-shape increases with laser power. The shaded regions A and B or the regions lower than 120 mW and higher than 320 mw of power levels in FIG. 9 represent the regions in which the send recessed dots 21b are formed.

The second dot 21b is formed in the lower and higher power level regions A and B of laser power in FIG. 9. However, silicon (particles) melted and removed scatter in the higher power level region B. The scattered particles accumulate on the semiconductor wafer 11e surface, and quality of a product includes fear to give influence. Therefore, the lower power level region A is more desirable, because the scattered particles will obstruct the element formation, and deteriorate quality of a product.

According to the semiconductor wafer 11e of the second embodiment, even if the first dots 21a having a protruding-shape are flattened by a repeated CMP process, the second dots 21b are not affected because of the recessed shape. In addition, even if the second recessed dots 21b are buried by sedimentation due to deposition processes such as repeated CVD and sputtering production process for the semiconductor device, the first dots 21a of the protruding-shape are not buried because such shape is the to reverse the second dots 21b.

Therefore, according to the semiconductor wafer 11e of the second embodiment, even when recognition failure occurs in the first type of ID mark 17e due to a CMP process, by the use of the second type of ID mark 22, the information can be read. In addition, even when recognition failure occurs in the second type of ID mark 22 due to a deposition process, by the use of the first type of ID mark 17e, the information can be read. Thus, consistent production control of the manufacturing processes of the semiconductor device can be enabled.

Furthermore, a special recessed part is not needed in order to make the first type of ID mark 17e and the second type of ID mark 22 for the first bevel contour 13a. Therefore, production of semiconductor wafer 11e is simplified.

First Modification of Second Embodiment

Figure 10:
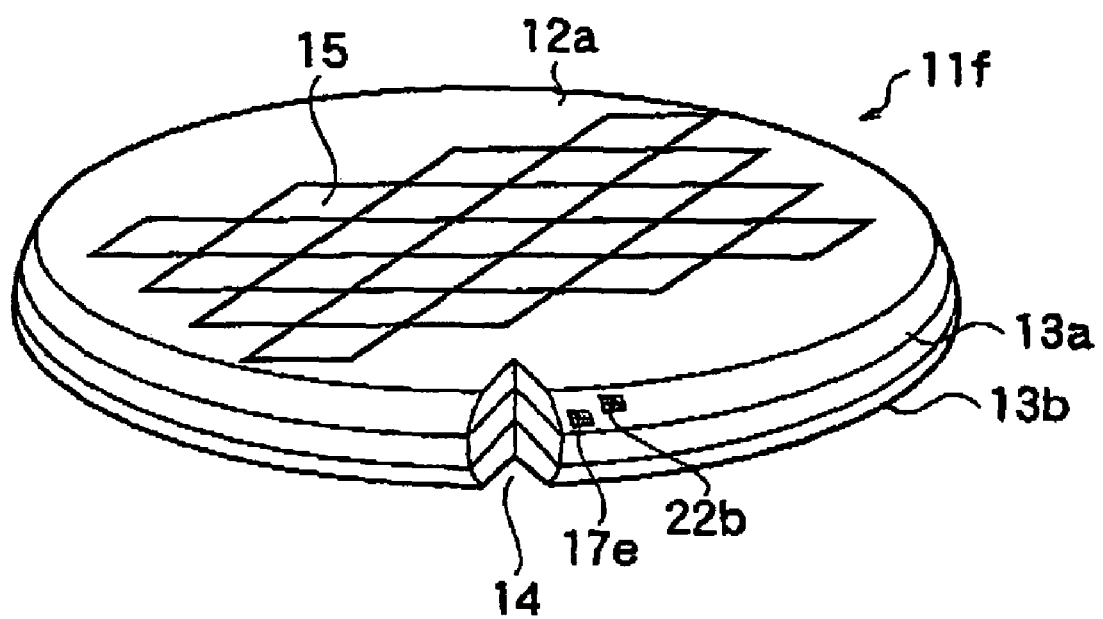
FIG. 10 is an outline view showing the configuration of a semiconductor wafer according to a first modification of the second embodiment of the present invention.

A semiconductor wafer 11f according to a first modification of the second embodiment of this invention is different from the semiconductor wafer 11e of second embodiment in that, as shown in FIG. 10, a first type of ID mark 17e of dots protruding from than the surface of the first bevel contour 13a is formed close to the notch 14 of the first bevel contour 13a, and a second type of ID mark 22b of recessed dots, recessed from the surface of the first bevel contour 13a are provided so as to be displaced from each other in the thickness direction and the circumferential direction of the semiconductor wafer 11f. The second type of ID mark 22 is indicated by 22b. Other elements are substantially the same as that of the semiconductor wafer lie shown in the second embodiment, therefore repeated explanation is omitted.

The first type of ID mark 17e and the second type of ID mark 22b are provided with a space of about 100 μm in the longitudinal direction (in the thickness direction of the wafer), and about 500 μm in the lateral direction (in the circumferential direction of the wafer) therebetween. The first type of ID mark 17e and the second type of ID mark 22b have an area of 100 μm×100 μm.

According to the first modification of the second embodiment, the first type of ID mark 17e of protruding dots and the second type of ID mark 22b of recessed dots are formed so as to be displaced from each other in the thickness direction and the circumferential direction of the semiconductor wafer 11f. Generally, in the CMP process intended for metal films such as W, Al, and Cu, the closer the protruding dots of the ID mark are to the second principal side 12b, than the surface of the wafer the less likely the dots are cut off. Even if the first protruding dots 21a are repeatedly affected by the CMP process, the second dots 21b are not damaged due to the recessed shape. In addition, even if the second recessed dots 21b are buried by sedimentation of deposition processes such as repeated CVD and sputtering, the first protruding dots 21a are not buried because such shape is the reverse compared to the second dots 21b.

Therefore, according to the semiconductor wafer 11f of the first modification the second embodiment, even when recognition failure occurs for the first type of ID mark 17e due to a CMP process, by the use of the second type of ID mark 22b, information can be read. In addition, even when recognition failure occurs for the second type of ID mark 22b due to deposition process, by the use of the first type of ID mark 17e, information can be read. Thus, the consistent production control of the manufacturing processes of the semiconductor device can be enabled.

Note that in the first modification of the second embodiment, the first type of ID mark 17e and the second type of ID mark 22b may be formed so as to be displaced from each other in the lateral direction, or may be aligned in the longitudinal direction.

Second Modification of Second Embodiment

Figure 11:
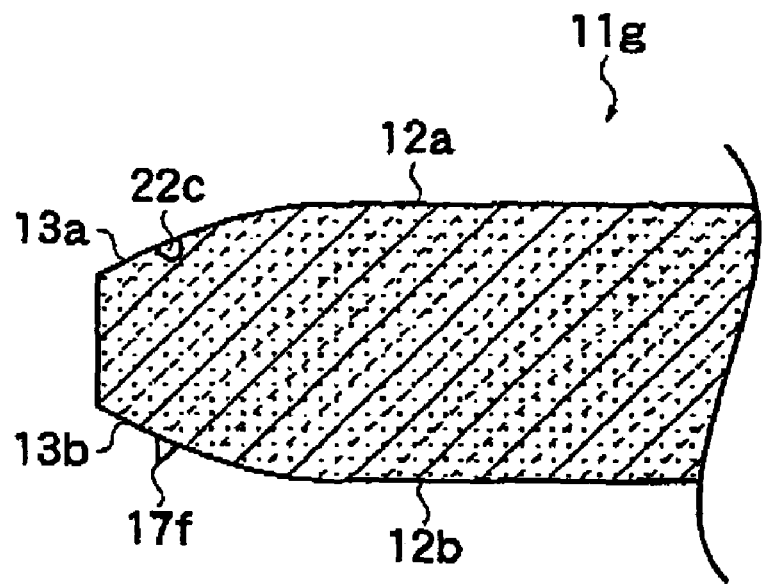
FIG. 11 is a sectional view showing a feature part of a semiconductor wafer according to a second modification of the second embodiment of the present invention.

A semiconductor wafer 11f according to a second modification of the second embodiment of the invention is different from the semiconductor wafer 11e shown in second embodiment in that, as shown in FIG. 11, a second type of ID mark 22c formed up of recessed dots, recessed from the surface of the first bevel contour 13a, is formed close to the notch 14 of the first bevel contour 13a, and a first type of ID mark 17f of protruding dots is provided on the surface of the second bevel contour 13b at the opposite side of the second type of ID mark 22c. The first type of ID mark 17 is indicated by 17f. The second type of ID mark 22 is indicated by 22c. Other elements are substantially the same as that of the semiconductor wafer lie shown in the second embodiment, therefore repeated explanation is omitted.

Generally, according to the semiconductor wafer 11g of the second modification the second embodiment, in the CMP process intended for metal films such as W, Al, and Cu or the like, the polishing cloth is not brought into contact with the backside of the semiconductor wafer 11g. Therefore, the first type of ID mark 17f is maintained without being cut off. In addition, even if the second recessed dots 21b on the upper side of the semiconductor wafer 11g is buried by sedimentation of repeated deposition processes such as CVD and sputtering as a production process of the semiconductor device, the first protruding dots 21a on the backside of the semiconductor wafer 11g are not buried.

Therefore, according to the semiconductor wafer 11g of the second modification the second embodiment, even when recognition failure occurs in the second type of ID mark 22c due to a CMP process, by the use of the first type of ID mark 17f, the information can be read. In addition, even when recognition failure occurs in the second type of ID mark 22c due to deposition process, by the use of the first type of ID mark 17f, the information can be read. Consistent production control of the manufacturing processes of the semiconductor device can be thus enabled.

Note that in the second modification of the second embodiment, the first type of ID mark 17f may be formed on the upper side of the semiconductor wafer 11e, and the second type of ID mark 22c may be formed on the backside of the semiconductor wafer 11g.

Third Modification of Second Embodiment

Figure 12:
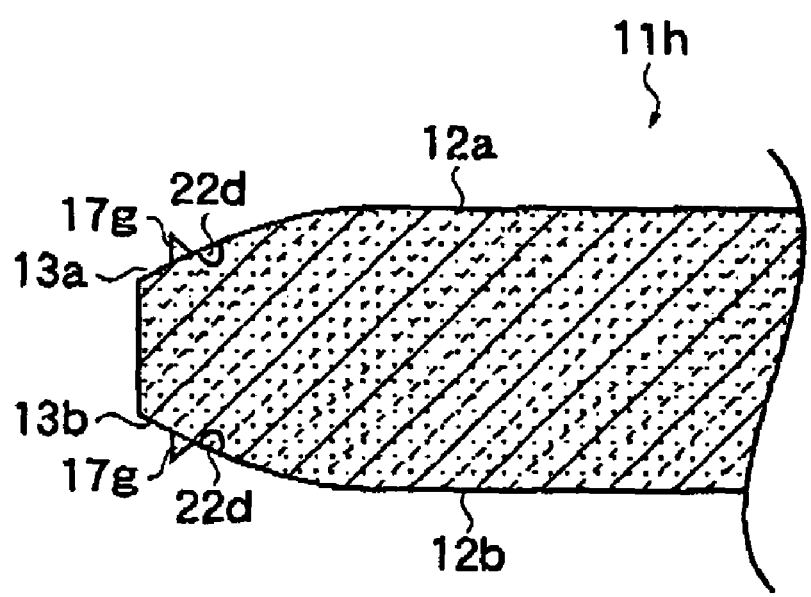
FIG. 12 is a sectional view showing a feature part of a semiconductor wafer according to a third modification of the second embodiment of the present invention.

A semiconductor wafer 11h according to a third modification of the second embodiment of the invention is different from the semiconductor wafer 11e shown in the second embodiment in that, as shown in FIG. 12, in the second modification, a first type of ID mark 17g of protruding dots and a second type of ID mark 22d of recessed dots are formed side by side at a part of both the first bevel contour 13a and the second bevel contour 13b close to the notch 14. The first type of ID mark 17 is indicated by 17g. The second type of ID mark 22 is indicated by 22d. Other elements are substantially the same as that of the semiconductor wafer 11e shown in the second embodiment, therefore repeated explanation is omitted.

According to the semiconductor wafer 11h of the third modification of the second embodiment, even if an ID mark of either type cannot be read among the four ID marks due to adhesion of a silicon particle to the first bevel contour 13a and the second bevel contour 13b, a CMP process, a deposition process, and other production processes of the semiconductor device or by wafer transportation, the ID mark is possible to be recognize by the use of either of the ID marks. Therefore, visibility of an ID mark is achieved in any kind of situation in a serial production process of the semiconductor device, the information can be read an ID mark of either side of the bevel contours. Consistent production control of the manufacturing processes of the semiconductor device can be thus enabled.

Fourth Modification of Second Embodiment

Figure 13:
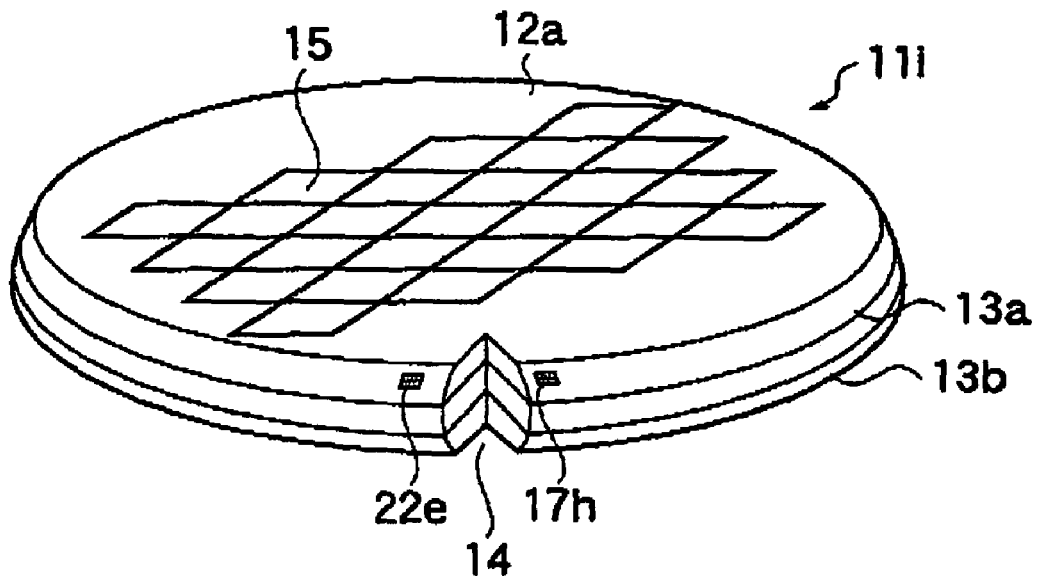
FIG. 13 is an outline view showing the configuration of a semiconductor wafer according to a fourth modification of the second embodiment of the present invention.

A semiconductor wafer 11i according to a fourth modification of the second embodiment is different from the semiconductor wafer 11e shown in the second embodiment in that, as shown in FIG. 13, a first type of ID mark 17h is formed at a portion of the first bevel contour 13a close to the notch 14, and the second type of ID mark 22e is formed at a portion of the first bevel contour 13a close to the notch 14 on the opposite side of the first type of ID mark 17h with the notch 14 interposed therebetween. The first type of ID mark 17 is indicated by 17h. The second type of ID mark 22 is indicated by 22e. Other elements are substantially the same as that of the semiconductor wafer 11e shown in the second embodiment, therefore repeated explanation is omitted.

According to the semiconductor wafer 11i of the fourth modification of the second embodiment, even when recognition failure occurs in one ID mark, by the use of the other ID mark, the information can be read. Consistent production control of the manufacturing processes of the semiconductor device can be thus enabled.

In addition, the position of the ID mark is not particularly limited. However, by serially providing the first type of ID mark 17h and the second type of ID mark 22e, a shortened movement time of the photoelectric transducer for reading the first type of ID mark 17h and the second type of ID mark 22e is achieved.

Third Embodiment

Figure 14:
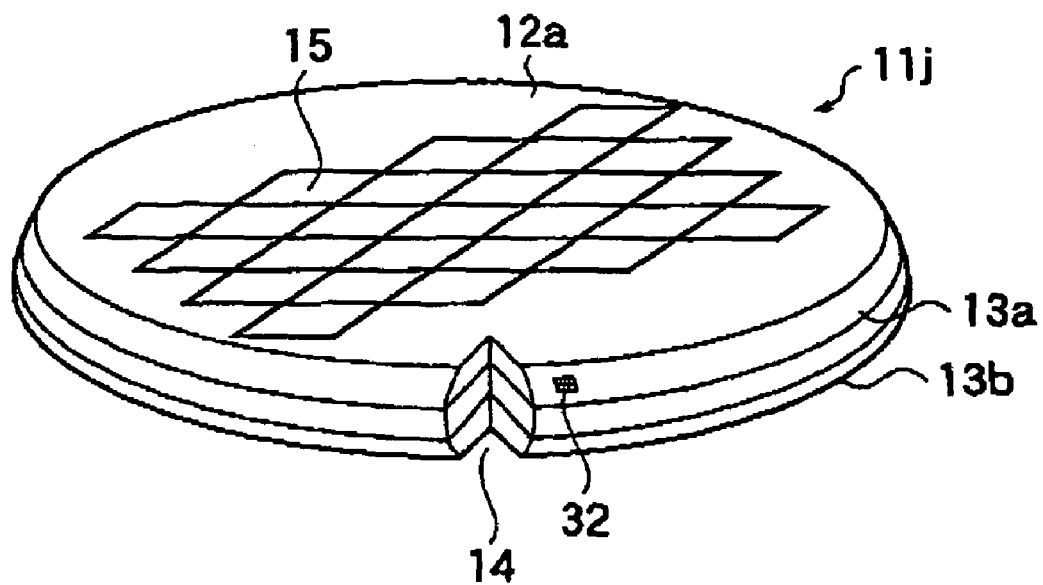
FIG. 14 is an outline view showing the configuration of a semiconductor wafer according to a third embodiment of the present invention.
Figure 15:
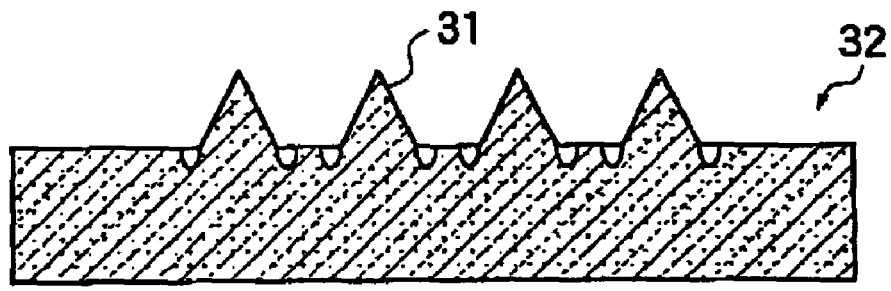
FIG. 15 is a sectional view showing an ID mark according to a third embodiment of the present invention.

A semiconductor wafer 11j according to a third embodiment is different from the semiconductor wafer 11e shown in the second embodiment in that, as shown in FIG. 14 and FIG. 15, a third type of ID mark 32 made up of third dots 31, each implemented by a protrusion protruded from the surface of the first bevel contour 13a and a plurality of depressions recessed from the surface of the first bevel contour 13a disposed around the protrusion is formed at a part of the first bevel contour 13a close to the notch 14. The third type of ID mark is indicated by reference number 32. Other elements are substantially the same as that of the semiconductor wafer lie shown in the second embodiment, therefore repeated explanation is omitted.

Figure 17:
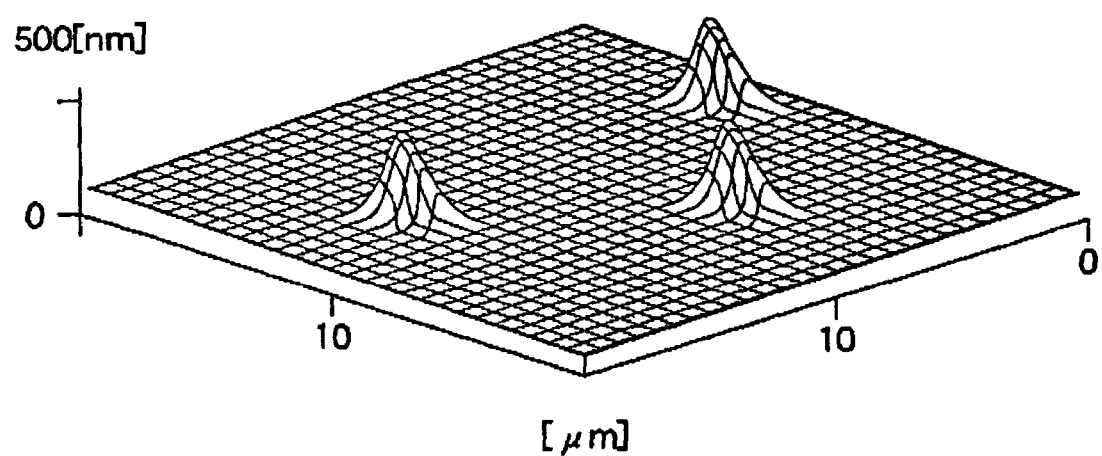
FIG. 17 is an AFM image showing the shape of a dot according to a third embodiment of the present invention.

For example, the third dots 31 are formed by the surface part of the bevel contour melted and recrystallized by a pulse laser beam irradiated continuously onto the surface of the bevel contour through an optical system. In order to form the third dots 31, irradiation power of a laser is optimized to melt the surface of silicon to make a molten pool. In the molten pool, a waving phenomenon occurs depending on the depth of the molten pool, size of the molten pool and viscosity of silicon solution. By the waving phenomenon, the third dots 31 become a ring-shaped depression depressed from the surface of the first bevel contour 13a around a protrusion that protrudes from the surface of the first bevel contour 13a as shown in FIG. 15 and FIG. 17.

Figure 16:
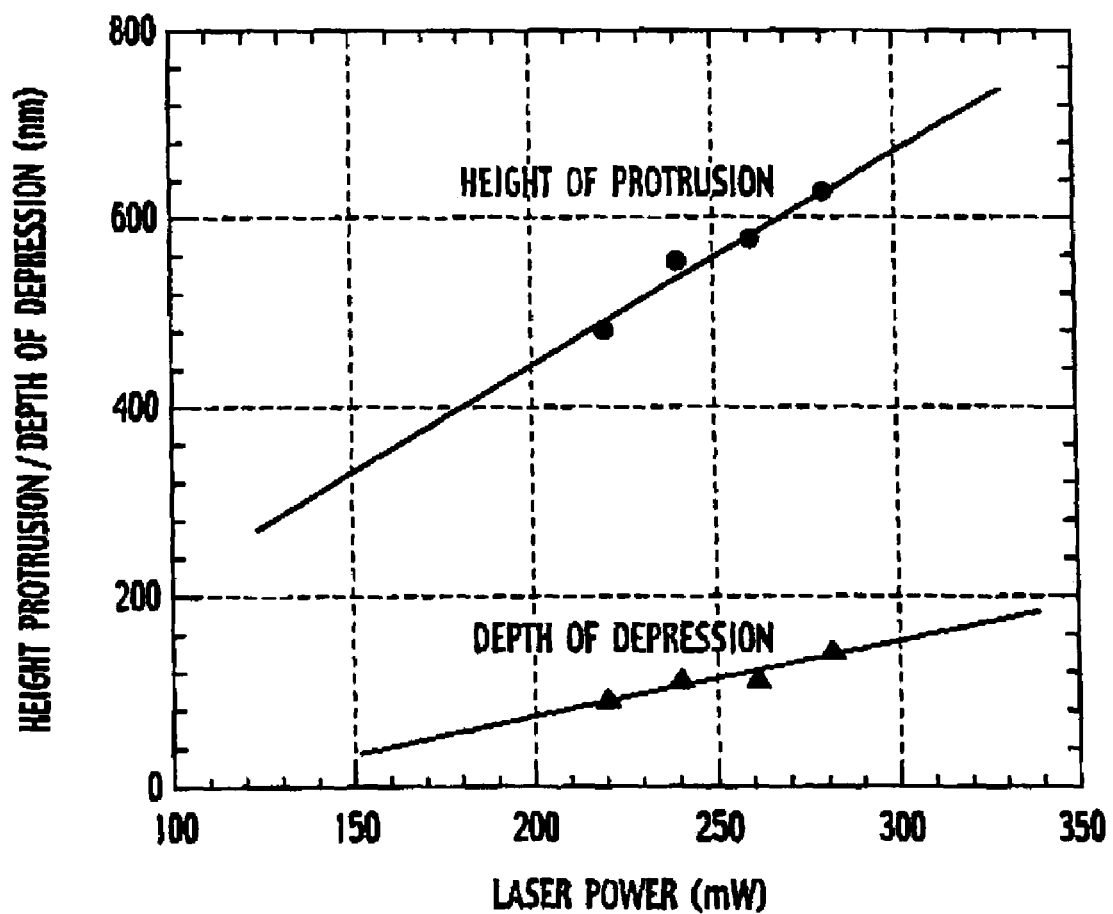
FIG. 16 is a graph showing relationship between the shape of a dot formed on semiconductor wafer and laser power according to a third embodiment of the present invention.

In FIG. 16, abscissa is laser power, and ordinate is protrusion height and depression depth. In other words FIG. 16 shows the relation between laser power and dot height. A protrusion becomes high with increasing laser power according to FIG. 16. In addition, the depression is deepened if laser power is high.

According to an experiment by the inventors, the ID mark formed by the protrusion dots and the depression dots can achieve stable recognition, if the height of the protrusion and depth of the depression is more than 100 nm when combined. Therefore, laser power is controlled so that height of the protrusion of the third dots 31 and depth of the depression of the third dots 31 is more than 100 nm. From FIG. 16, it is preferable that laser power is more than 250 mW.

According to the semiconductor wafer 11g of the third embodiment, even when recognition failure occurs in the protrusion of the third type of ID mark 32 due to a CMP process, by the use of the remaining depressions of the third type of ID mark 32, the information can be read. In addition, even when recognition failure occurs in the depression of the third type of ID mark 32 due to a deposition process, by the use of the rest of the protrusion of the third type of ID mark 32, the information can be read. Consistent production control of the manufacturing processes of the semiconductor device can be thus enabled.

Furthermore, according to the semiconductor wafer 11j of the third embodiment, because a protrusion and a depression are formed simultaneously by laser irradiation, the number of ID marks can be reduced, and production of an ID mark is facilitated.

First Modification of Third Embodiment

Figure 18A:
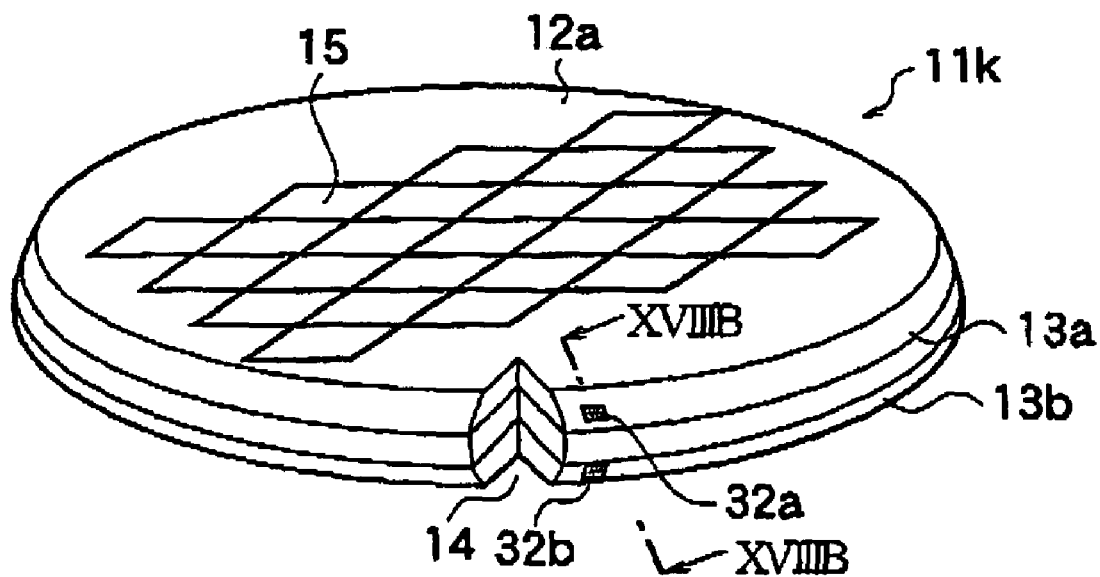
FIG. 18A is an outline view showing the configuration of a semiconductor wafer according to a first modification of the third embodiment of the present invention.
Figure 18B:
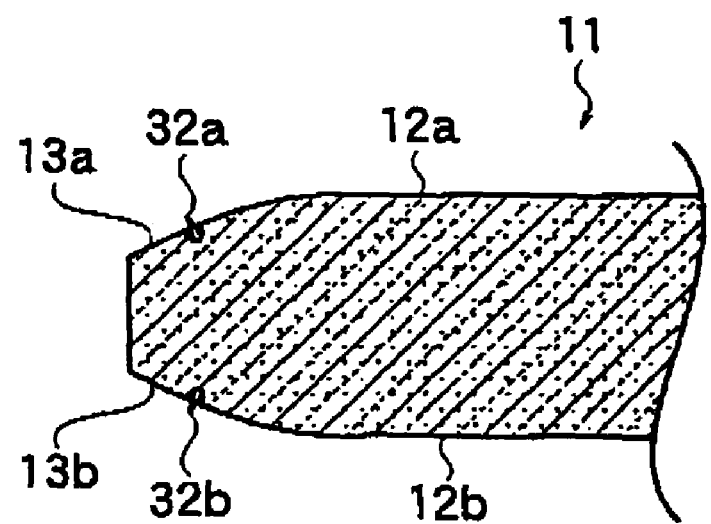
FIG. 18B is a sectional view taken on line XVIIB-XVIIB in FIG. 18A.

A semiconductor wafer 11k according to a first modification of the third embodiment of this invention is different from the semiconductor wafer 11j shown in third embodiment in that, as shown in FIGS. 18A and 18B, the third type of ID mark 32 is formed close to the notch 14 of the first bevel contour 13a, and a third type of ID mark 32b is formed at the opposite side of the part of the third type of ID mark 32a. The third type of ID mark 32 is indicated by 32a and 32b. Other elements are substantially the same as that of the semiconductor wafer 11j shown in the third embodiment, therefore repeated explanation is omitted.

Therefore, according to the semiconductor wafer 11k of the first modification of the third embodiment, even when recognition failure occurs for planing the third type of ID mark 32a on the first principal side 12a, by the use of the third type of ID mark 32b on the second principal side 12b, the information can be read. The consistent production control of the manufacturing processes of the semiconductor device can be thus enabled.

Fourth Embodiment

Figure 19:
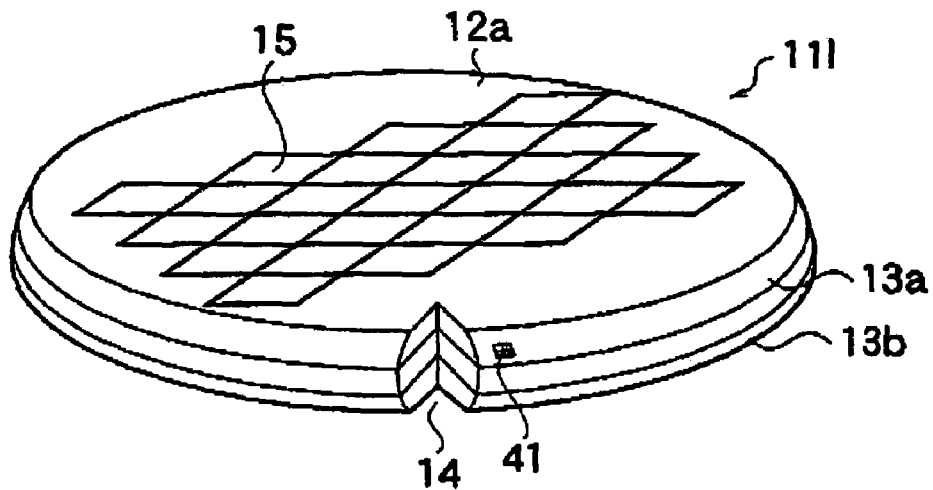
FIG. 19 is an outline view showing the configuration of semiconductor wafer according to a fourth modification of the present invention.

A semiconductor wafer 11l according to a fourth embodiment of this invention is different from the semiconductor wafer 11j shown in the third embodiment in that, as shown in FIG. 19, a fourth type of ID mark 41 provided as a combination with first protruding dots 21a and second recessed dots 21b are formed close to the notch 14 at a portion of the first bevel contour 13a. Other elements are substantially the same as that of the semiconductor wafer 11j shown in the third embodiment, therefore repeated explanation is omitted.

Figure 20A:
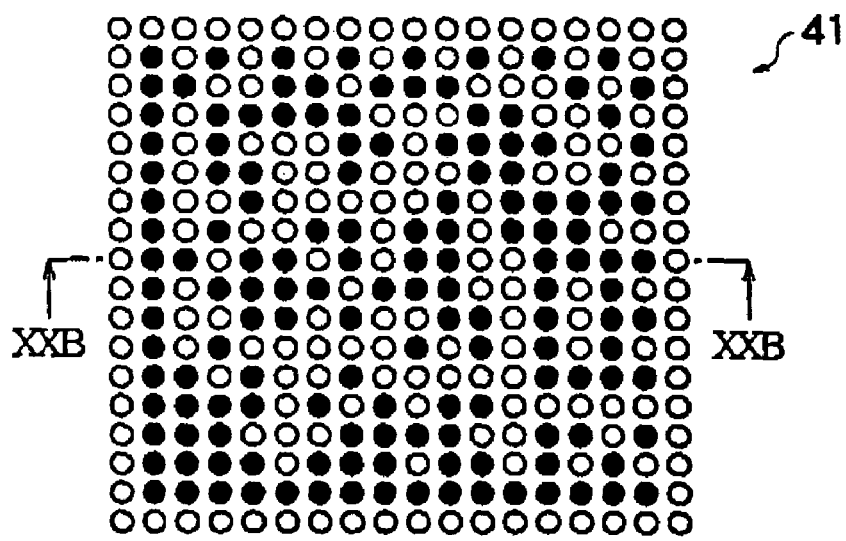
FIG. 20A is a figure of a dot pattern showing a configuration of an ID mark according to a fourth embodiment of the present invention.
Figure 20B:
FIG. 20B is a sectional view taken on line xxB-xxB in FIG. 20A.

The fourth type of ID mark 41 is arranged as shown in FIG. 20A and FIG. 20B by the pattern relation that the first dots 21a and the second dots 21b are reversal. According to an experiment by the inventors, each ID mark formed by the protruding dots and the recessed shape dots can provide stable recognition, if the height of the protrusion and depth of the recess are more than 100 nm together, i.e., from the bottom of the depression to the top of the protrusion.

According to the semiconductor wafer 11l of the fourth embodiment, even when recognition failure occurs in the first protruding dots 21a due to the CMP process, by the use of the second recessed dot 21b, the information can be read.

In addition, even when recognition failure occurs in the recess of the second dots 21b due to a deposition process, by the use of the first protruding dots 21a, the information can be read. Consistent production control of the manufacturing processes of the semiconductor device can be thus enabled.

Fifth Embodiment

Figure 21:
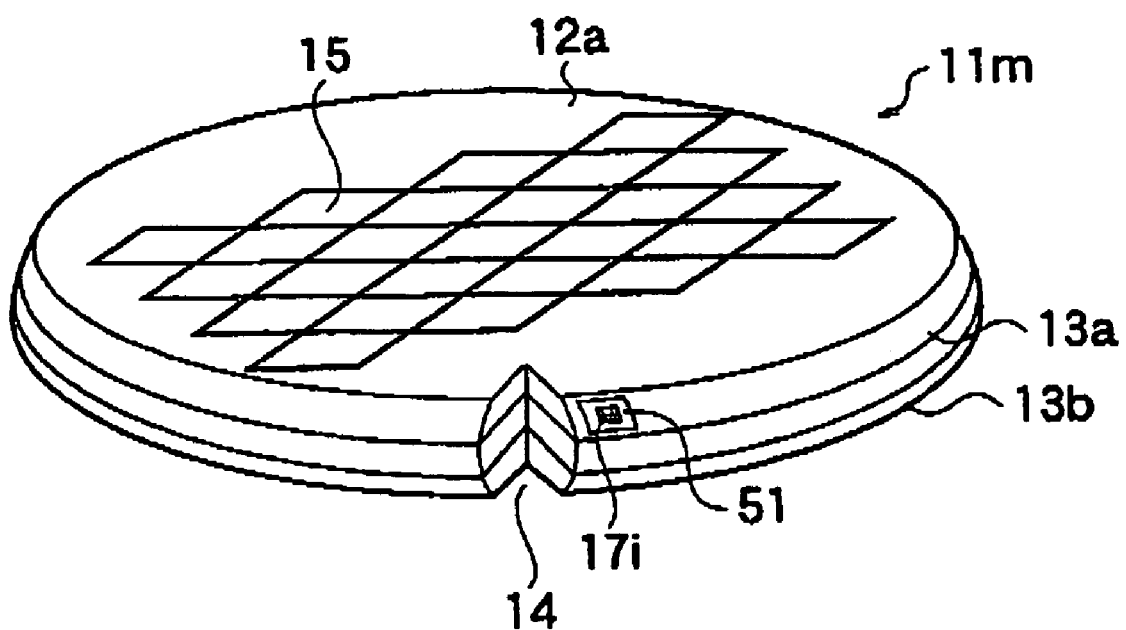
FIG. 21 is an outline view showing the configuration of a semiconductor wafer according to a fifth embodiment of the present invention.

A semiconductor wafer 11m according to a fifth embodiment of the invention is different from the semiconductor wafer 11a shown in the first embodiment in that, as shown in FIG. 21, a first type of ID mark 17i is formed on flat part 51 close to the notch 14 at a portion of the first bevel contour 13a. The first type of ID mark 17 is indicated by 17i. Other elements are substantially the same as that of the semiconductor wafer 11a shown in the first embodiment, therefore repeated explanation is omitted.

Flat part 51 is formed by irradiation of stepless pulse laser beam in a desired region of the first bevel contour 13a. The part 51 is considered to be flat by forming a minute dot group in an irradiated part. According to an experiment by inventors, when the height of a minute dot formed by the minute dot group is less than 100 nm, part 51 is considered to be flat. Furthermore desirable height of a minute dot formed by the minute dot group is less than 50 nm. As for intervals between minute dots formed by a minute dot group, 3 µm is preferable. In addition, when the height of the first dot 21a of the first type of ID mark 17i formed by the flat part 51 is more than 100 nm, the information can be read. Furthermore, a desirable height of the first dot 21a is more than 400 nm.

Figure 22:
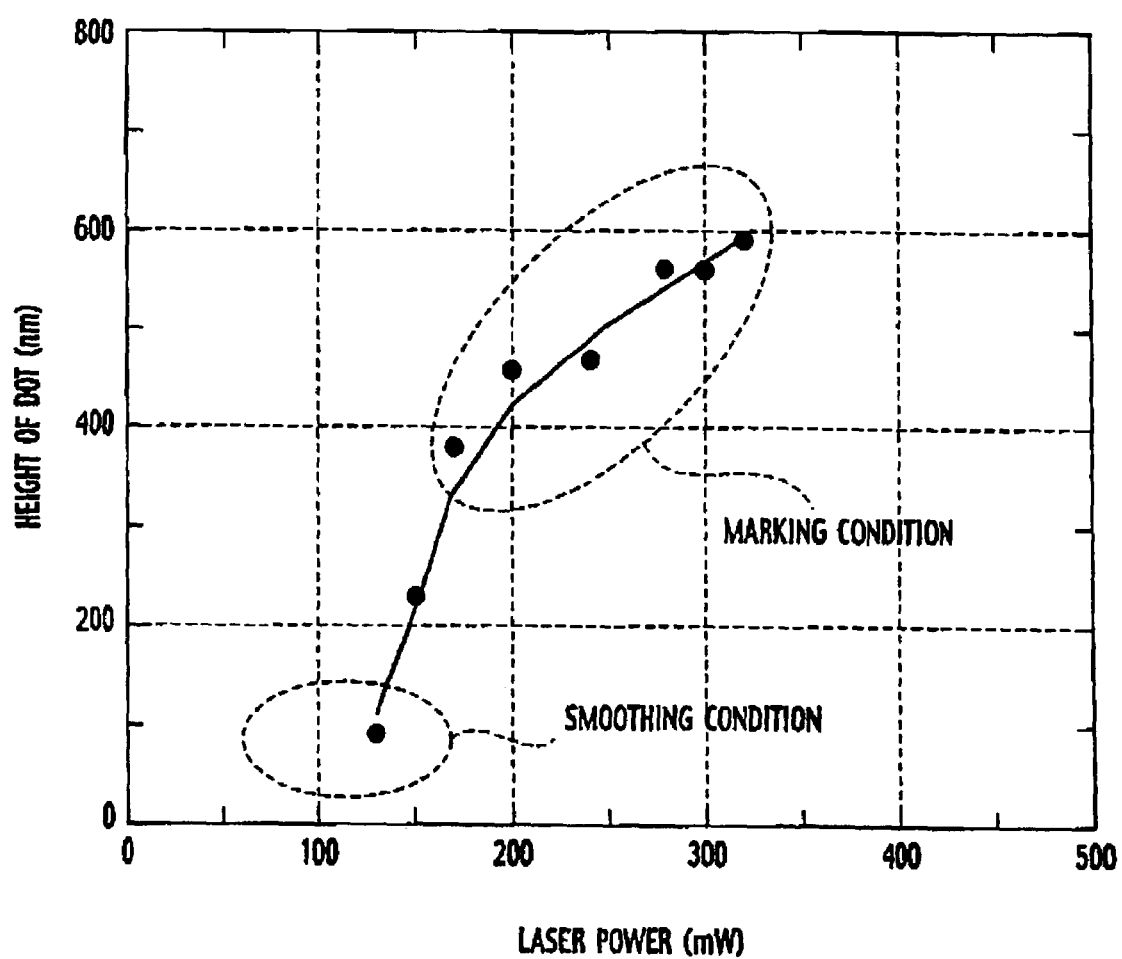
FIG. 22 is a graph showing relationship between the shape of a dot formed on semiconductor wafer and laser power according to a fifth embodiment of the present invention.

In FIG. 22 horizontal axis represents laser power, and ordinate is dot height. In other words a graph of FIG. 22 shows the relation between laser power and dot height. As shown in a graph of FIG. 22, when flat part 51 is formed, laser power is set in a range of 100 mW to 130 mW. In addition, when the first type of ID mark 17a is formed, laser power is set in a level of 160 mW to 320 mW.

A method to form the first type of ID mark 17i in the semiconductor wafer 11m will be explained with reference to FIGS. 23A and FIG. 23C below.

Figure 23A:
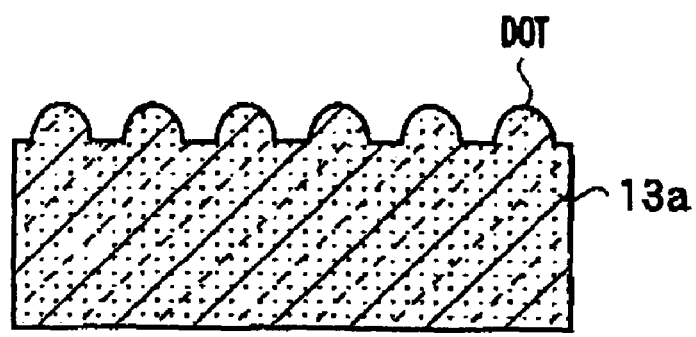
FIGS. 23A to 23C are sectional views showing a method of manufacturing a semiconductor wafer according to a fifth embodiment of the present invention.

(A) As shown in FIG. 23A, the semiconductor wafer 11m having a error ID mark 53 representing a error code formed on the first bevel contour 13a, or the first bevel contour 13a having more than 100 nm roughness the first bevel contour 13a are prepared.

Figure 23B:
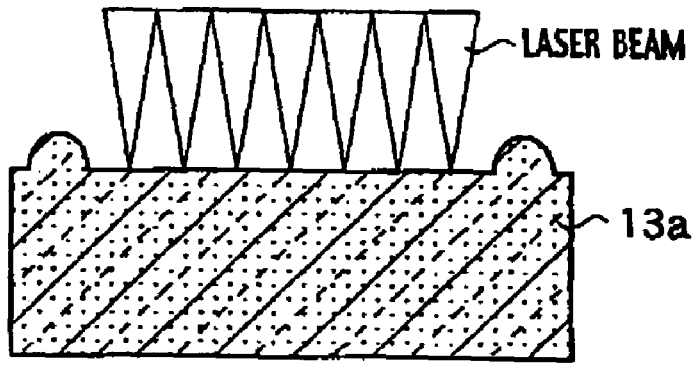

(B) Next, as shown in FIG. 23B, a stepless pulse laser beam controls laser power in a range of 100 mW to 130 mW, and irradiates a point for the flat part 51 of the first bevel contour 13a.

Figure 23C:
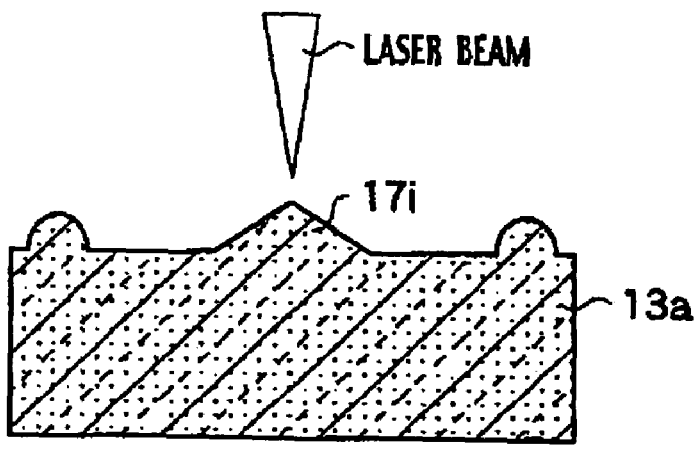

(C) Next, as shown in FIG. 23C, a stepless pulse laser beam controls laser power in a range of 160 mW to 320 mW, and irradiates the flat part 51. The first type of ID mark 17i is formed by the above process.

According to the semiconductor wafer 11m of the fifth embodiment, even when the error ID mark 53 representing the error code is formed due an operator's mistake or a machine error, the error ID mark 53 is erased by smoothing, and the first type of ID mark 17i of a correct code can be newly formed. In addition, even when the semiconductor wafer 11m having a large roughness is used in the first bevel contour 13a, the first type of ID mark 17i of superior recognition can be formed by smoothing the first bevel contour 13a.

Other Embodiments

The semiconductor wafer 11a according to the first embodiment is described to form the first type of ID mark 17a to the bevel contour 13a, but it may be formed to only the second bevel contour 13b.

Figure 24A:
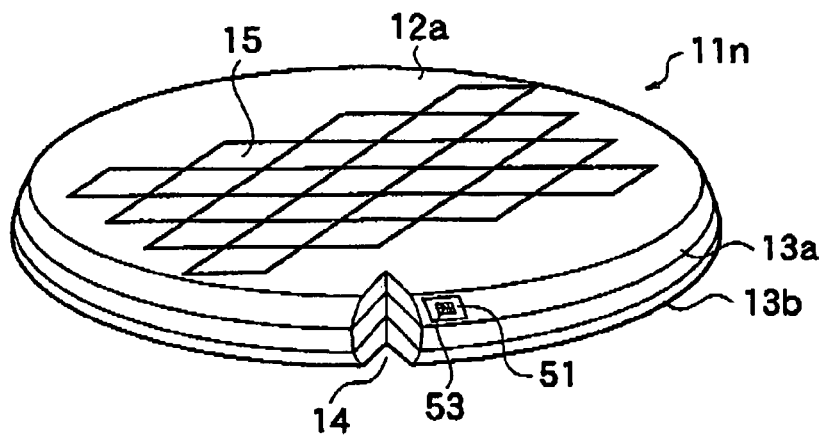
FIGS. 24A to 24C are outline views showing a method of manufacturing a semiconductor wafer according to another embodiment of the invention.
Figure 24B:
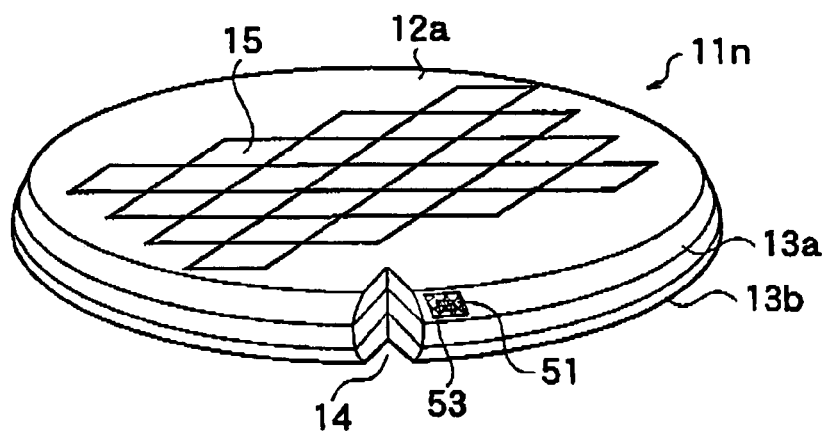
Figure 24C:
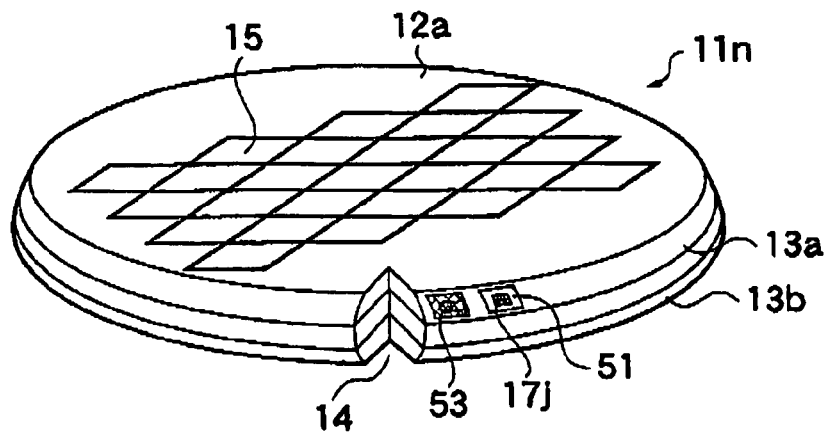

In addition, in the fifth embodiment, the error ID mark 53 of the error code was smoothed, and the first type of ID mark 17i of an correct code was formed in the same point. However, as shown in FIG. 24A, when the error ID mark 53 is formed on semiconductor wafer 11n, a minute dot group is formed by irradiating a stepless pulse laser beam to a region of the error ID mark 53. At that time, the error ID mark 53 is not recognized by setting a marking condition of the error ID mark 53, setting a laser beam output, setting an interval equally between dots. At a subsequent time, as shown in FIG. 24C, the first type of ID mark 17j of the correct code may be formed at a different point from the point where the error ID mark 53 was formed to.

In addition, the semiconductor wafer 11a-m according with the first to fifth embodiments, notch 14 is arranged as a standard feature or a standard sign to show a standard position of a wafer, but in particular it is not a limited feature. If a photoelectric conversion device can recognize an orientation flat or a minute seal as a standard position, such flats or seals may be used.

In addition, it was explained that the semiconductor wafer 11a-m according to the first to fifth embodiments is silicon. However, gallium arsenide (GaAs), indium phosphide (InP), silicon calcium carbide (SiC), aluminum oxide ($Al_2O_3$) and gallium nitride (GaN) may be applied to the semiconductor wafer 11a-m.

In addition, it was explained that the semiconductor wafer 11m according to the fifth embodiment, after the first bevel contour 13a is smoothed, the first type of ID mark 17i is formed. Means to do the above described smoothing may be applied to the semiconductor wafer 11a-l according to the first to fourth embodiments. Namely, a bottom face of the first recess 16a shown in the first embodiment may be turned into a flat part 51, and the ID mark shown in the second to fourth embodiments may be formed on the flat part 51.

In other words, the details of each of the semiconductor wafers 11a-m according to the first to fifth embodiments may be combined in various combination.

Various modifications will become possible for those skilled in the art after receiving the teachings of the present disclosure without departing from the scope thereof.

What is claimed is:

1. A semiconductor wafer comprising:
a first principal side and a second principal side opposite to each other;
a first bevel contour and a second bevel contour provided at an outer peripheral part of the first principal side and the second principal side;
a first type of ID mark of protruding dots provided on at least one of the first bevel contour and the second bevel contour; and
a second type of ID mark of recessed dots being the same code as the first type of ID mark, and provided on at least one of the first bevel contour and the second bevel contour.

2. The semiconductor wafer of claim 1, wherein the second type of ID mark is displaced in the thickness direc tion and the circumferential direction of the semiconductor wafer from the first type of ID mark.

3. The semiconductor wafer of claim 1, wherein the first type of ID mark and the second type of ID mark are provided on at least one of a flat part formed of the first bevel contour and the second bevel contour.

4. The semiconductor wafer of claim 3, wherein the flat part comprises a minute dot group.

5. The semiconductor wafer of claim 4, wherein height of the minute dot group is equal to or less than 5 nm, and height of a first dot is more than 100 nm.

* * * * *